(12) United States Patent
Briere

(10) Patent No.: US 9,378,965 B2
(45) Date of Patent: Jun. 28, 2016

(54) HIGHLY CONDUCTIVE SOURCE/DRAIN CONTACTS IN III-NITRIDE TRANSISTORS

(75) Inventor: Michael A. Briere, Woonsocket, RI (US)

(73) Assignee: Infineon Technologies Americas Corp., El Segundo, CA (US)

( * ) Notice: Subject to any disclaimer, the term of this patent is extended or adjusted under 35 U.S.C. 154(b) by 204 days.

(21) Appl. No.: 12/653,240

(22) Filed: Dec. 10, 2009

(65) Prior Publication Data

US 2011/0140169 A1    Jun. 16, 2011

(51) Int. Cl.
| H01L 21/768 | (2006.01) |
| H01L 21/285 | (2006.01) |
| H01L 29/417 | (2006.01) |
| H01L 29/66 | (2006.01) |
| H01L 29/20 | (2006.01) |
| H01L 29/423 | (2006.01) |

(Continued)

(52) U.S. Cl.
CPC .... H01L 21/28587 (2013.01); H01L 29/41725 (2013.01); H01L 29/66462 (2013.01); H01L 29/66522 (2013.01); H01L 29/2003 (2013.01); H01L 29/42376 (2013.01); H01L 29/4966 (2013.01); H01L 29/518 (2013.01); H01L 29/7787 (2013.01)

(58) Field of Classification Search
CPC ............ H01L 29/452; H01L 29/66462; H01L 29/7787
USPC .............. 257/20, 192, 194, E29.14, E29.143, 257/E29.144, 750
See application file for complete search history.

(56) References Cited

U.S. PATENT DOCUMENTS

| 6,884,704 B2 * | 4/2005 | Hussain et al. ............... 438/572 |
| 2003/0213975 A1 * | 11/2003 | Hirose et al. .................. 257/194 |

(Continued)

FOREIGN PATENT DOCUMENTS

| JP | H 3-248469 | 11/1991 |
| JP | 2007-294528 | 11/2007 |

(Continued)

OTHER PUBLICATIONS

Yuvaraj et al.: "ZrO2 Gate Dielectrics Produced by Ultraviolet Ozone Oxidation for GaN and AlGaN/GaN Transistors", Journal of Vacuum Science and Technology: Part B, AVS / AIP, Melville, New York, NY, US, vol. 24, No. 2, Feb. 8, 2006 pp. 575-581.

*Primary Examiner* — Mark Tornow
(74) *Attorney, Agent, or Firm* — Farjami & Farjami LLP

(57) ABSTRACT

In one embodiment, a method for fabricating a III-Nitride transistor on a III-Nitride semiconductor body is disclosed. The method comprises etching dielectric trenches in a field dielectric overlying gate, source, and drain regions of the III-Nitride semiconductor body, and thereafter forming a gate dielectric over the gate, source and drain regions. The method further comprises forming a blanket diffusion barrier over the gate dielectric layer, and then removing respective portions of the blanket diffusion barrier from the source and drain regions. Thereafter, gate dielectric is removed from the source and drain regions to substantially expose the source and drain regions. Then, ohmic contacts are formed by depositing contact metal in the source and drain regions. The method results in highly conductive source/drain contacts that are particularly suitable for power transistors, for example, III-Nitride transistors, such as GaN transistors. In another embodiment, a structure for highly conductive source/drain contacts is disclosed.

7 Claims, 14 Drawing Sheets

(51) Int. Cl.
*H01L 29/49* (2006.01)
*H01L 29/51* (2006.01)
*H01L 29/778* (2006.01)

(56) References Cited

U.S. PATENT DOCUMENTS

| | | |
|---|---|---|
| 2005/0139870 A1* | 6/2005 | Hikita et al. .................. 257/280 |
| 2006/0124962 A1* | 6/2006 | Ueda et al. .................... 257/192 |
| 2007/0018199 A1* | 1/2007 | Sheppard et al. ............. 257/200 |
| 2007/0164322 A1* | 7/2007 | Smith et al. ................... 257/256 |
| 2007/0170463 A1* | 7/2007 | Ueno et al. .................... 257/192 |
| 2008/0083932 A1* | 4/2008 | Briere ........................... 257/192 |
| 2008/0185613 A1* | 8/2008 | Beach et al. .................. 257/192 |
| 2008/0284022 A1* | 11/2008 | Ehara ................ H01L 21/28229 257/751 |
| 2008/0286915 A1 | 11/2008 | Dungan |

FOREIGN PATENT DOCUMENTS

| | | |
|---|---|---|
| WO | WO 2008/097551 | 8/2008 |
| WO | WO 2009/012536 | 1/2009 |

\* cited by examiner

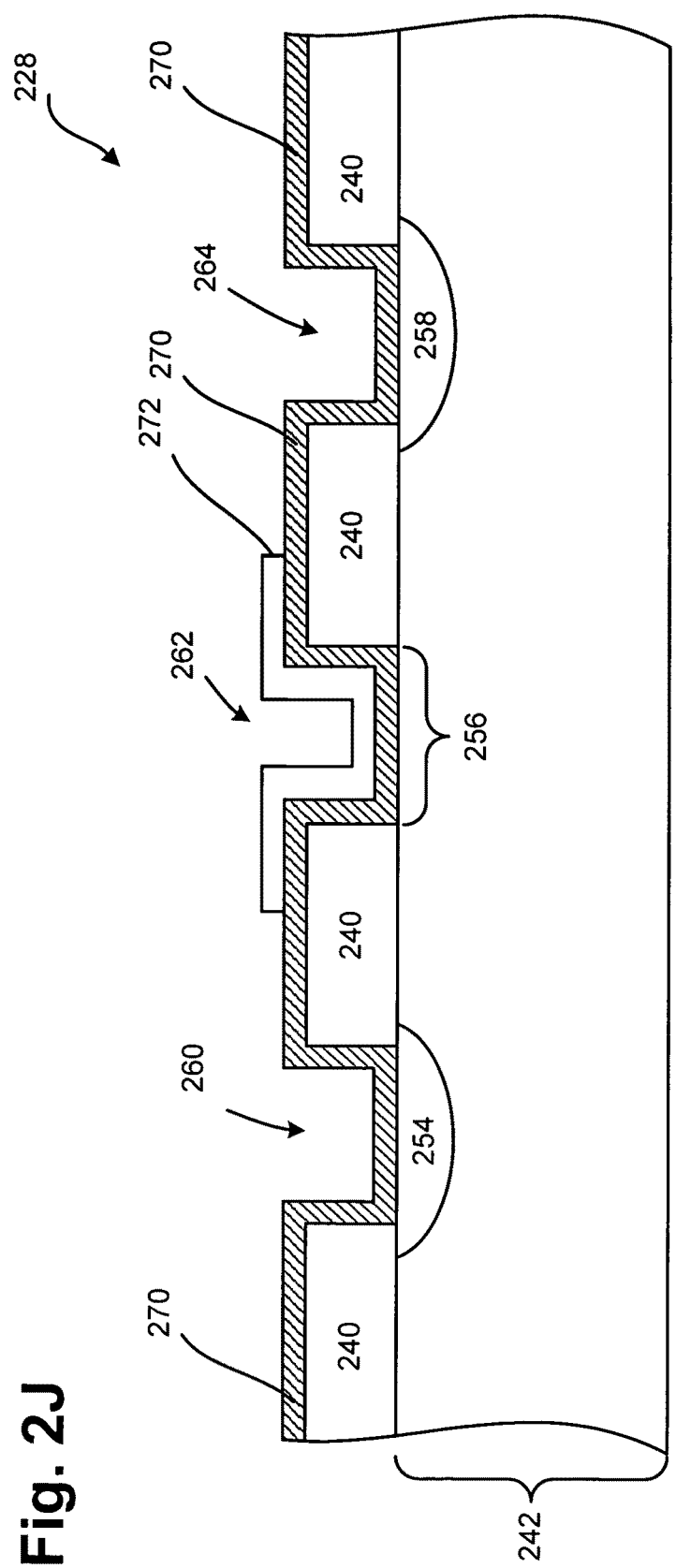

HIGHLY CONDUCTIVE SOURCE/DRAIN CONTACTS IN III-NITRIDE TRANSISTORS

DEFINITION

In the present application, "III-Nitride," "III-Nitride device," "III-Nitride transistor," III-Nitride semiconductor," and the like refer to compound semiconductors that include nitrogen and at least one group III element, such as, but not limited to, GaN, AlGaN, InN, AlN, InGaN, InAlGaN and the like.

BACKGROUND OF THE INVENTION

1. Field of the Invention

The present invention is generally in the field of semiconductors. More specifically, the present invention is in the field of fabrication of semiconductor transistors.

2. Background Art

Prior to the present invention, metallic diffusion barriers have been used in gate, source, and drain regions. Materials used for such diffusion barriers include titanium nitride. Such diffusion barriers, while providing useful functions, such as electrical conduction to the layers below, and providing a barrier against diffusion of subsequent undesirable materials into underlying regions when forming various regions, such as gate regions in a field effect transistor (FET) and/or in a high electron mobility transistor (HEMT) in III-Nitride technology, have presented certain disadvantages. For example, in adding such diffusion barriers, the resistance between the source/drain contacts and the source/drain regions in a FET or HEMT is increased. Such increased resistance diminishes the performance of transistors, such as current carrying capability and speed of transistors, which are specially important in III-Nitride power transistors, such as III-Nitride HEMTs.

It would be advantageous to reduce resistance between drain and source contacts and the respective underlying drain and source regions, while still using diffusion barriers, such as titanium nitride for the remaining portions of the transistors, such as part of the gates in FETs and/or HEMTs.

SUMMARY OF THE INVENTION

The present invention is directed to highly conductive source/drain contacts in III-Nitride transistors, substantially as shown in and/or described in connection with at least one of the figures, and as set forth in the claims.

BRIEF DESCRIPTION OF THE DRAWINGS

FIG. 2J shows an exemplary structure resulting from performing an intermediate step according to the flowchart in FIGS. 1A and 1B.

DETAILED DESCRIPTION OF THE INVENTION

Figure 1A:
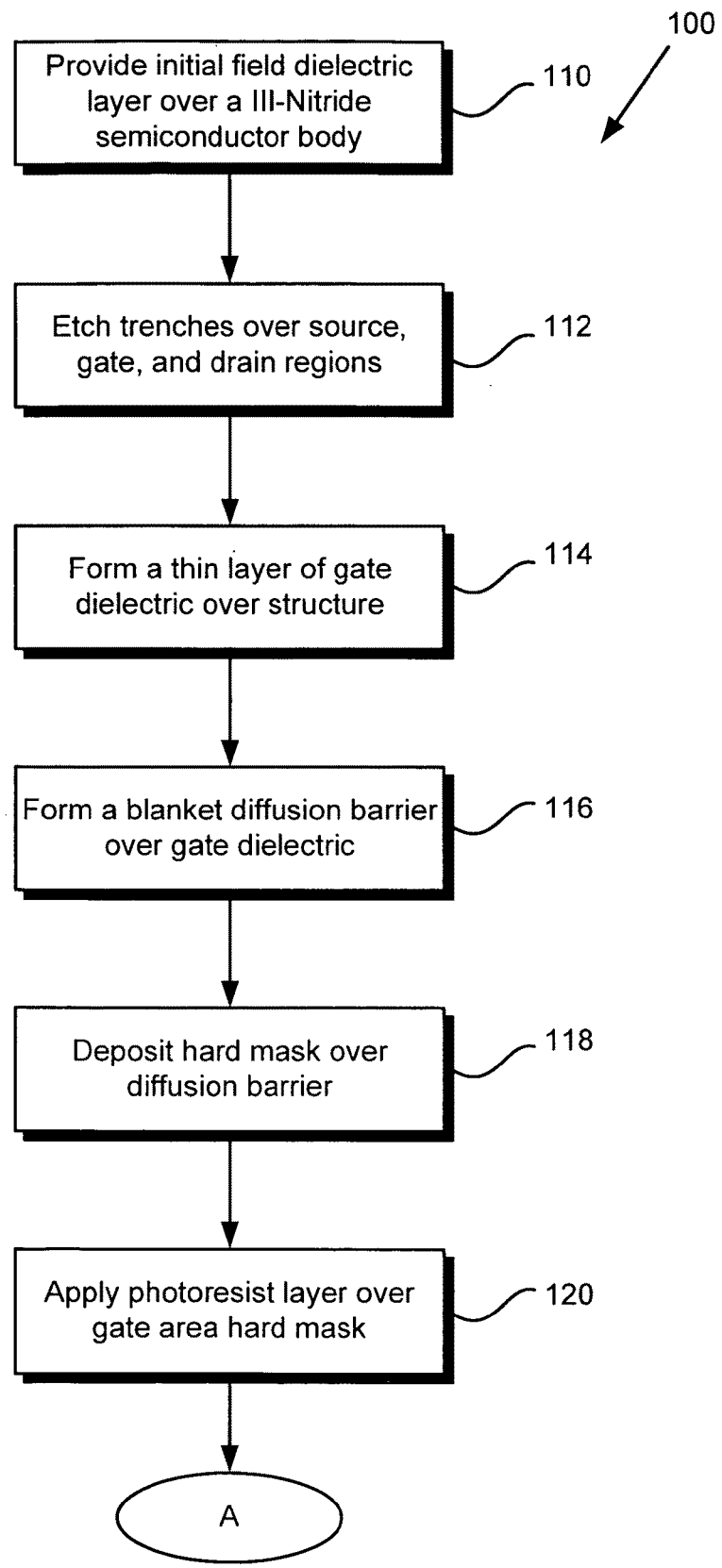
FIG. 1A shows part of an exemplary flowchart for a method for fabricating highly conductive source/drain contacts according to one embodiment of the present invention.

The present invention is directed to highly conductive source/drain contacts in III-Nitride transistors. Although the invention is described with respect to specific embodiments, the principles of the invention, as defined by the claims appended herein, can obviously be applied beyond the specifically described embodiments of the invention described herein. Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely example embodiments of the invention. To maintain brevity, other embodiments of the invention, which use the principles of the present invention, are not specifically described in the present application and are not specifically illustrated by the present drawings. It should be borne in mind that, unless noted otherwise, like or corresponding elements among the Figures may be indicated by like or corresponding reference numerals.

Figure 1B:
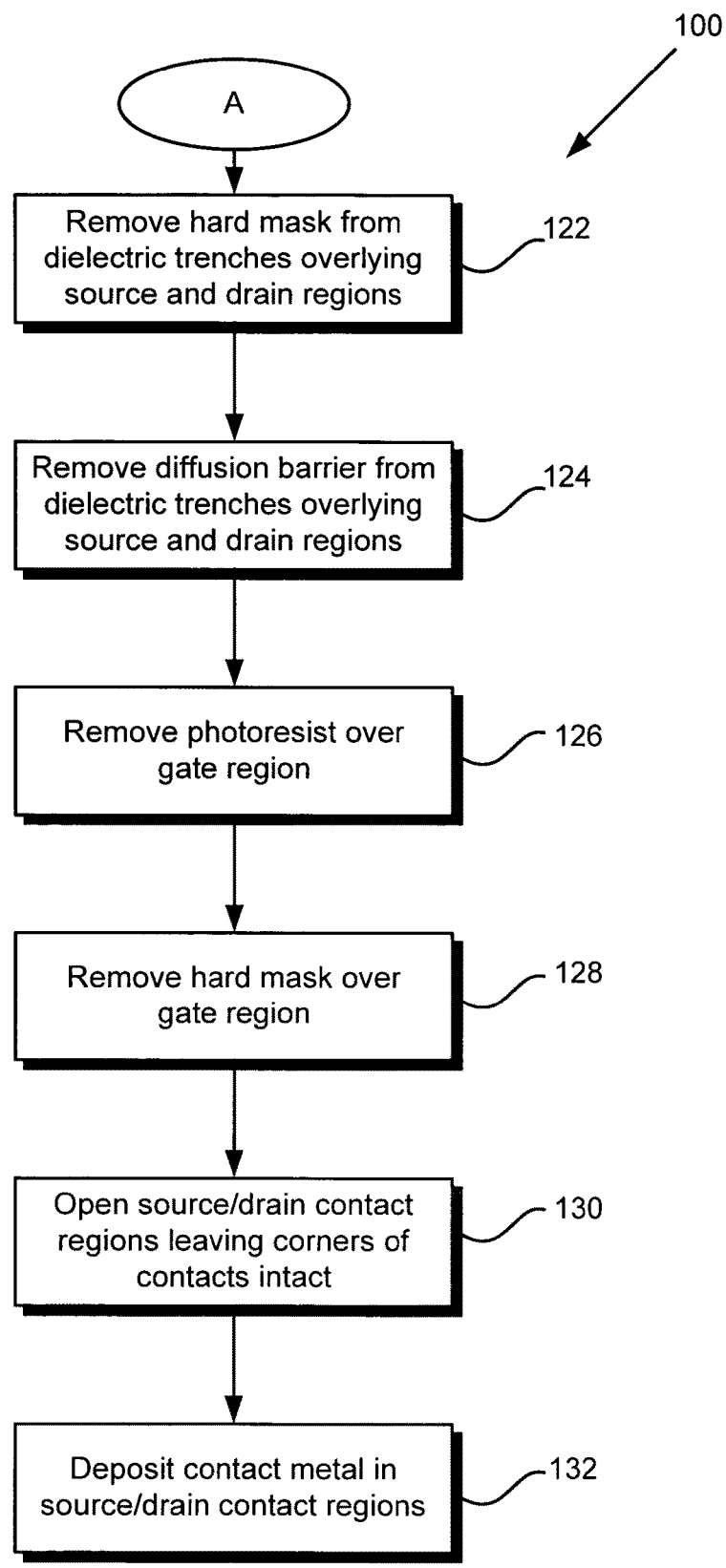
FIG. 1B shows part of the exemplary flowchart for a method for fabricating highly conductive source/drain contacts according to one embodiment of the present invention.

FIGS. 1A and 1B show flowchart 100 illustrating an exemplary method, according to one embodiment of the present invention, for fabricating highly conductive source/drain contacts as well as a special diffusion-barrier protected gate. Certain details and features have been left out of flowchart 100 that are apparent to a person of ordinary skill in the art. For example, a step may comprise one or more substeps or may involve specialized equipment or materials, as known in the art. While steps 110 through 132 indicated in flowchart 100 are sufficient to describe one embodiment of the present invention, other embodiments of the invention may utilize steps different from those shown in flowchart 100.

It is to be noted that the drawings in the present application, such as FIGS. 2A through 2L, are generally not to scale, and relative dimensions of various layers and regions, and their relative thicknesses may be, and generally are, different than those actually shown in the drawings. It is also noted that the structures shown in FIGS. 2A through 2L are provided as specific implementations of the present inventive principles, and are shown with such specificity for the purposes of easier illustration of the inventive concepts using specific examples. It should further be understood that particular details such as the materials used to form structures 210 through 232, and the techniques used to produce the various depicted features, are being provided as examples, and should not be interpreted as limitations. For example, although the embodiments shown in FIGS. 2A through 2L represent fabrication of certain source, gate, and drain structures having certain materials, shapes, geometries, and/or architectures, other embodiments of the present invention may have different materials or varying shapes, geometries, and/or architectures.

Figure 2A:
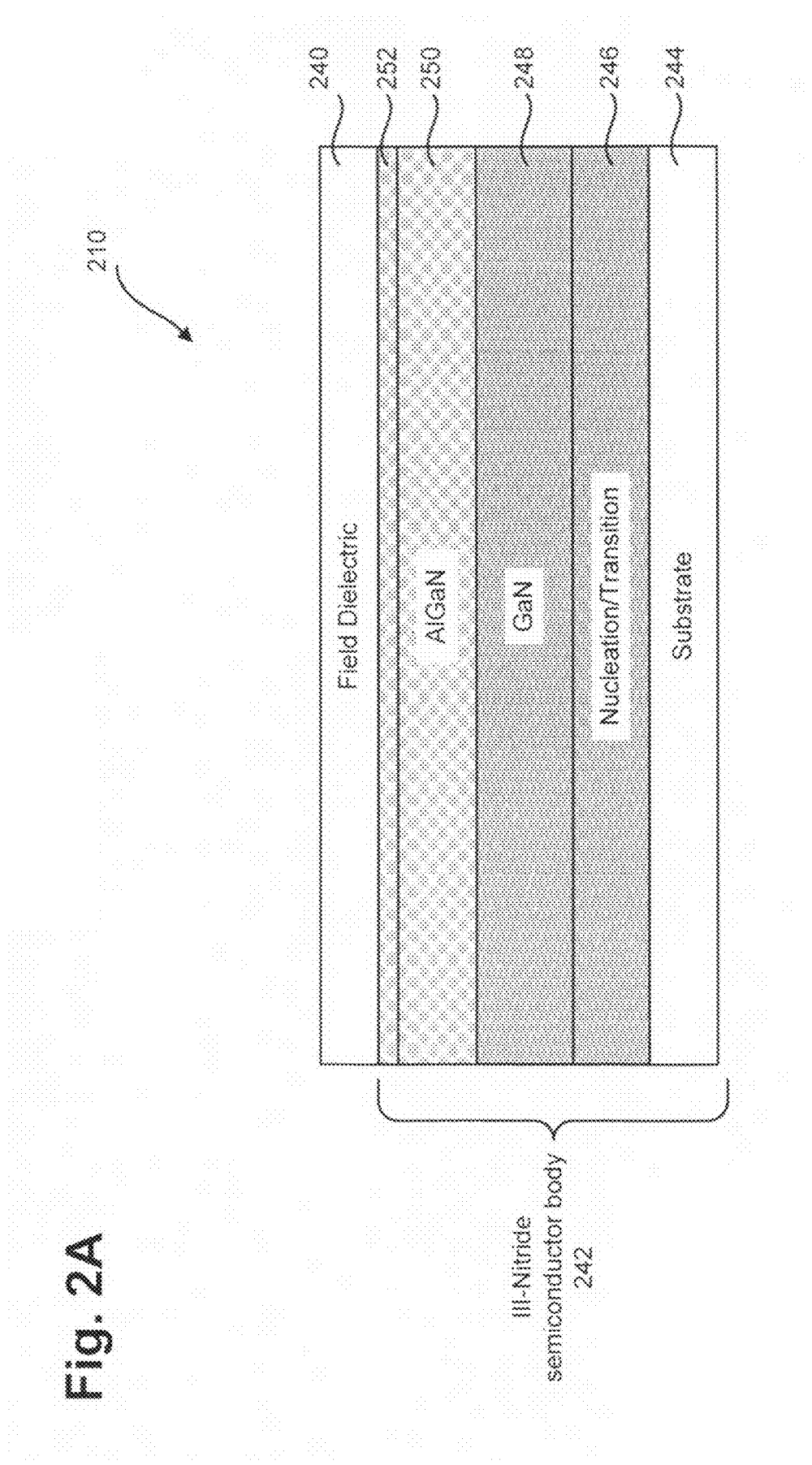
FIG. 2A shows an exemplary structure resulting from performing an initial step according to the flowchart in FIGS. 1A and 1B.

Beginning with step 110 in FIG. 1A and structure 210 in FIG. 2A, step 110 of flowchart 100 comprises providing field dielectric layer 240 overlying exemplary III-Nitride semiconductor body 242. Exemplary III-Nitride semiconductor body 242 may be, or may ultimately be formed to be, a field effect transistor (FET) and/or a high electron mobility transistor (HEMT) and/or another semiconductor device. As shown in FIG. 2A, III-Nitride semiconductor body 242 may have substrate layer 244, nucleation/transition layer 246 overlying substrate layer 244, gallium nitride (GaN) layer 248 overlying nucleation/transition layer 246, and aluminum gallium nitride layer (AlGaN) 250 overlying gallium nitride (GaN) layer 248. Optionally, a thin layer of GaN 252 may be situated between AlGaN layer 250 and field dielectric layer 240.

Field dielectric layer 240 may include known field dielectric materials such as silicon nitride, which may or may not be stoichiometric silicon nitride. Also, in one or more embodiments, such deposition of field dielectric layer 240 may be formed by a low-pressure chemical vapor deposition (LPCVD) or another process. Field dielectric layer 240 generally results in a reduction of electric field between overlying interconnect lines and underlying III-Nitride semiconductor body 242. In one embodiment, field dielectric layer 240 may also serve to passivate the underlying AlGaN layer. In another embodiment, such passivation may also arise from optional thin GaN layer 252 either alone or in conjunction with field dielectric layer 240.

Referring to FIGS. 2B through 2L, corresponding structures 212 through 232 show the result of performing on structure 210 steps 112 through 132 of flowchart 100 of FIGS. 1A and 1B, respectively. For example, structure 212 shows the resulting structure after processing step 112, structure 214 shows the resulting structure after processing step 114, and so forth.

Figure 2B:
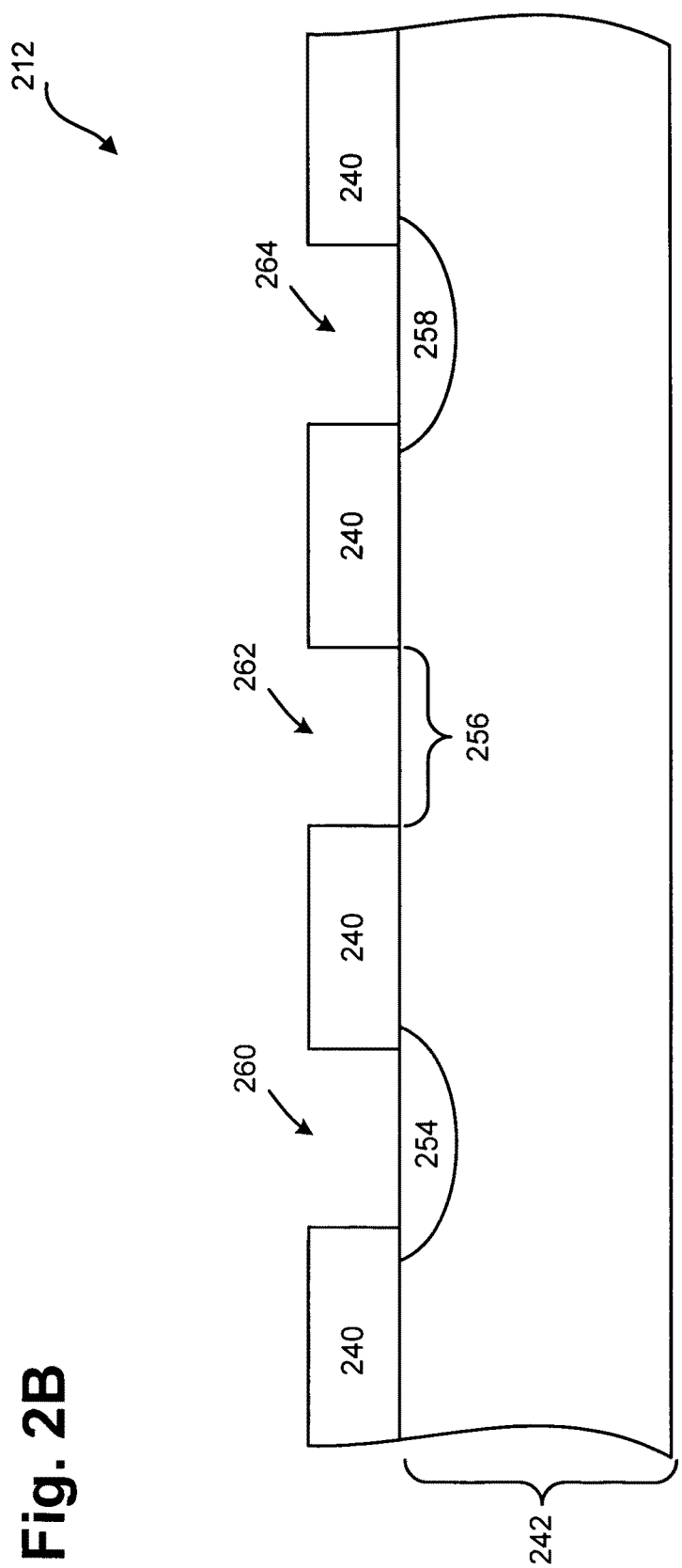
FIG. 2B shows an exemplary structure resulting from performing an intermediate step according to the flowchart in FIGS. 1A and 1B.

Continuing on to step 112 in FIG. 1A and structure 212 in FIG. 2B, step 112 of flowchart 100 comprises etching field dielectric layer 240 to form respective dielectric trenches 260, 262, and 264. As shown in structure 212 of FIG. 2B, dielectric trench 260 generally overlies source region 254 in underlying III-Nitride semiconductor body 242, dielectric trench 262 overlies gate region 256 in underlying III-Nitride semiconductor body 242, and dielectric trench 264 generally overlies drain region 258 in underlying III-Nitride semiconductor body 242.

Figure 2C:
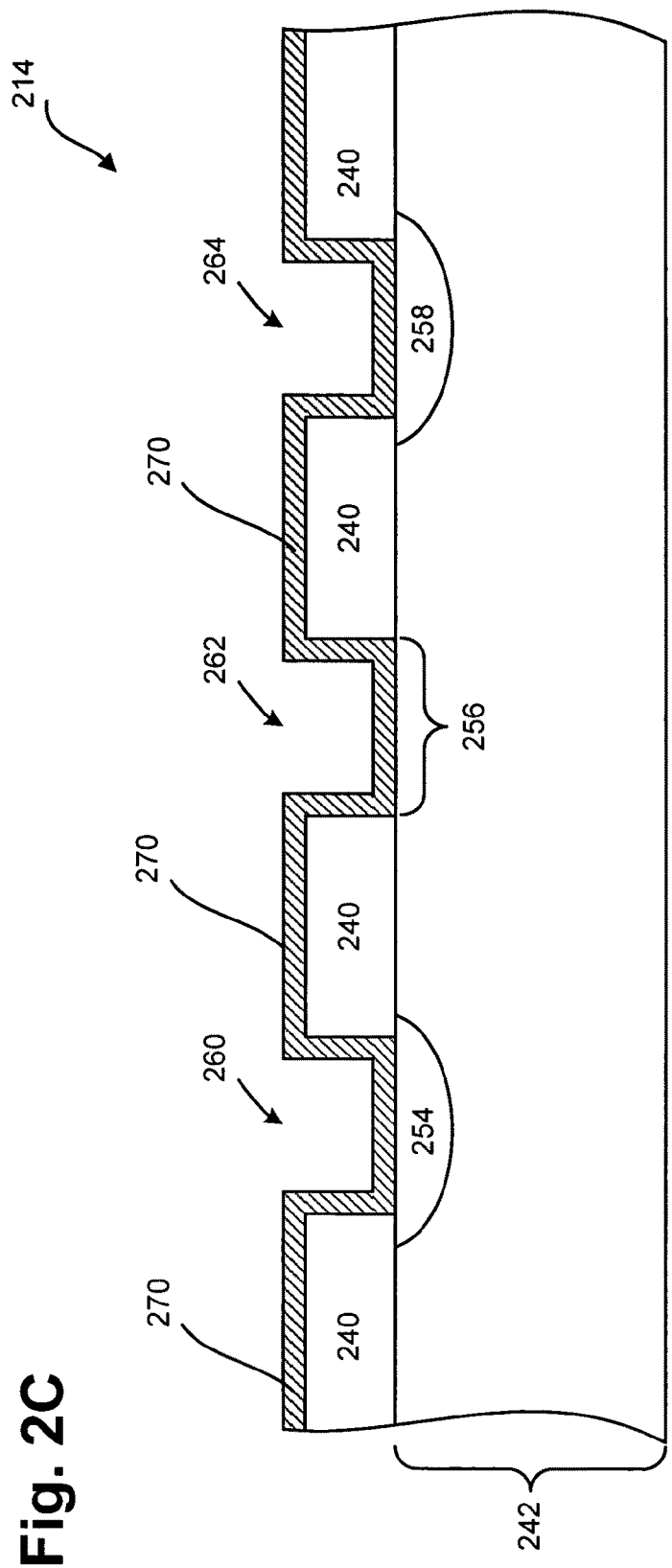
FIG. 2C shows an exemplary structure resulting from performing an intermediate step according to the flowchart in FIGS. 1A and 1B.

Continuing with step 114 of flowchart 100 and structure 214 in FIG. 2C, step 114 comprises forming thin layer of gate dielectric 270 over the new topography present in field dielectric layer 240 with its dielectric trenches 260, 262, and 264. Gate dielectric 270 can comprise a dielectric such as silicon nitride which may be stoichiometric silicon nitride or a non-stoichiometric silicon nitride. Gate dielectric 270 may be formed by various methods of deposition, for example, an LPCVD deposition.

Figure 2D:
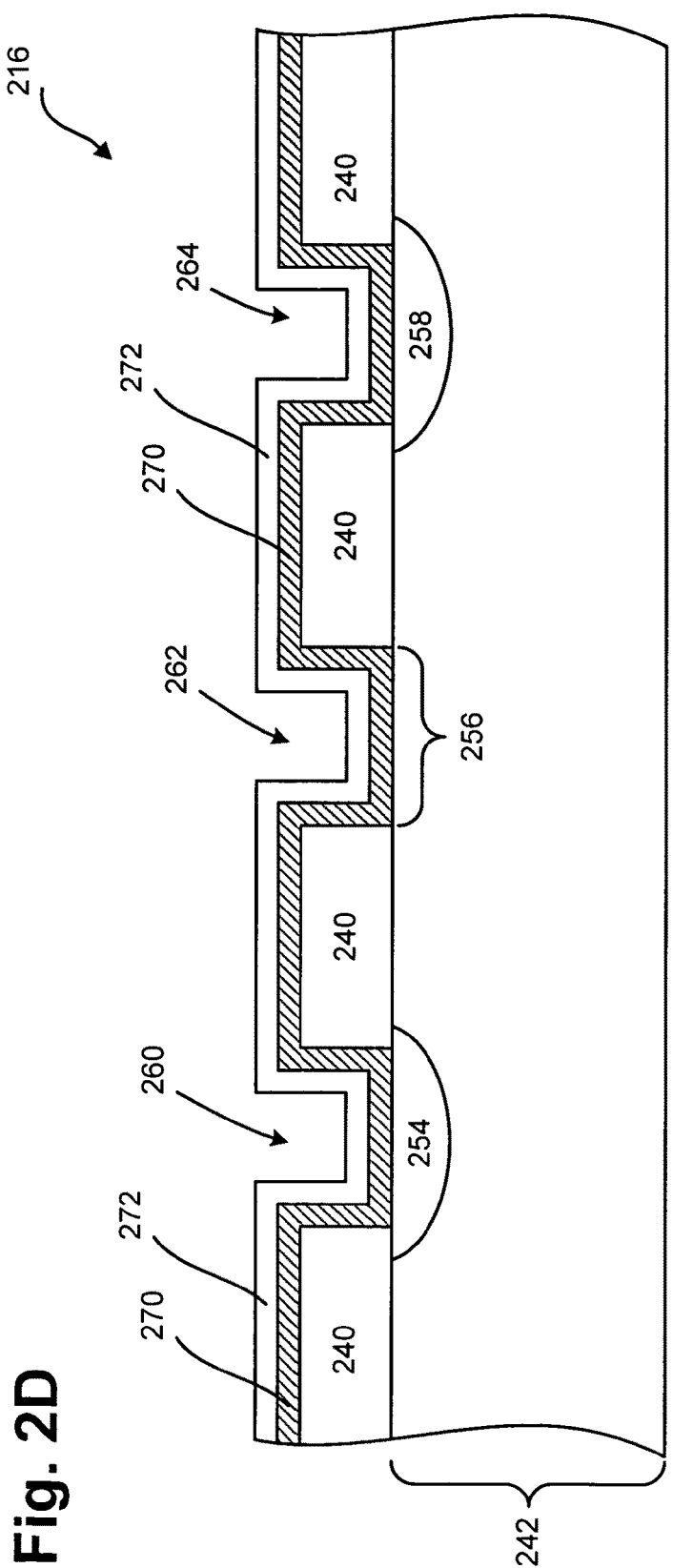
FIG. 2D shows an exemplary structure resulting from performing an intermediate step according to the flowchart in FIGS. 1A and 1B.
Figure 2E:
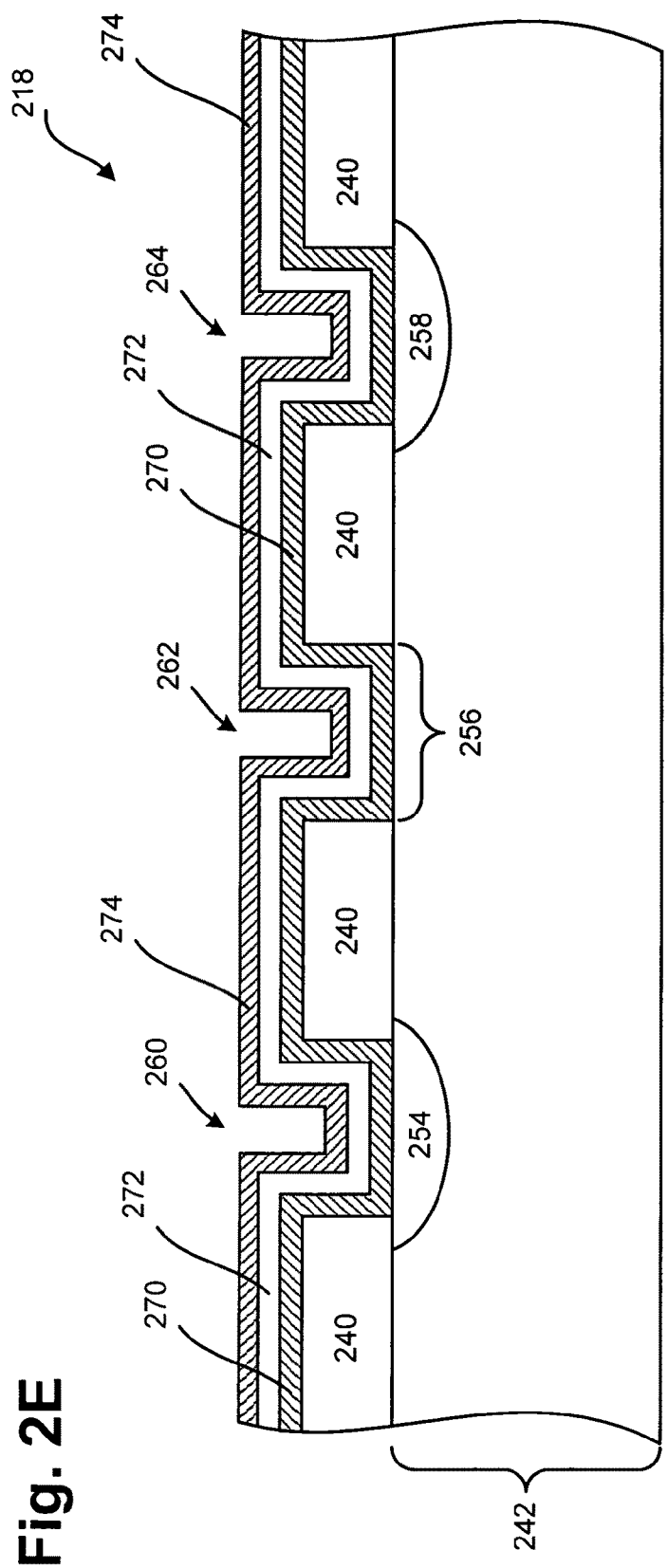
FIG. 2E shows an exemplary structure resulting from performing an intermediate step according to the flowchart in FIGS. 1A and 1B.

As indicated in step 116 of flowchart 100 and structure 216 of FIG. 2D, step 116 comprises forming blanket layer of diffusion barrier material 272, such as titanium nitride, over structure 214 of FIG. 2C. This is followed by step 118 of flowchart 100 of FIG. 1A and structure 218 in FIG. 2E where step 118 comprises depositing hard mask layer 274, such as silicon dioxide, over diffusion barrier layer 272 of structure 216 of FIG. 2D.

Figure 2F:
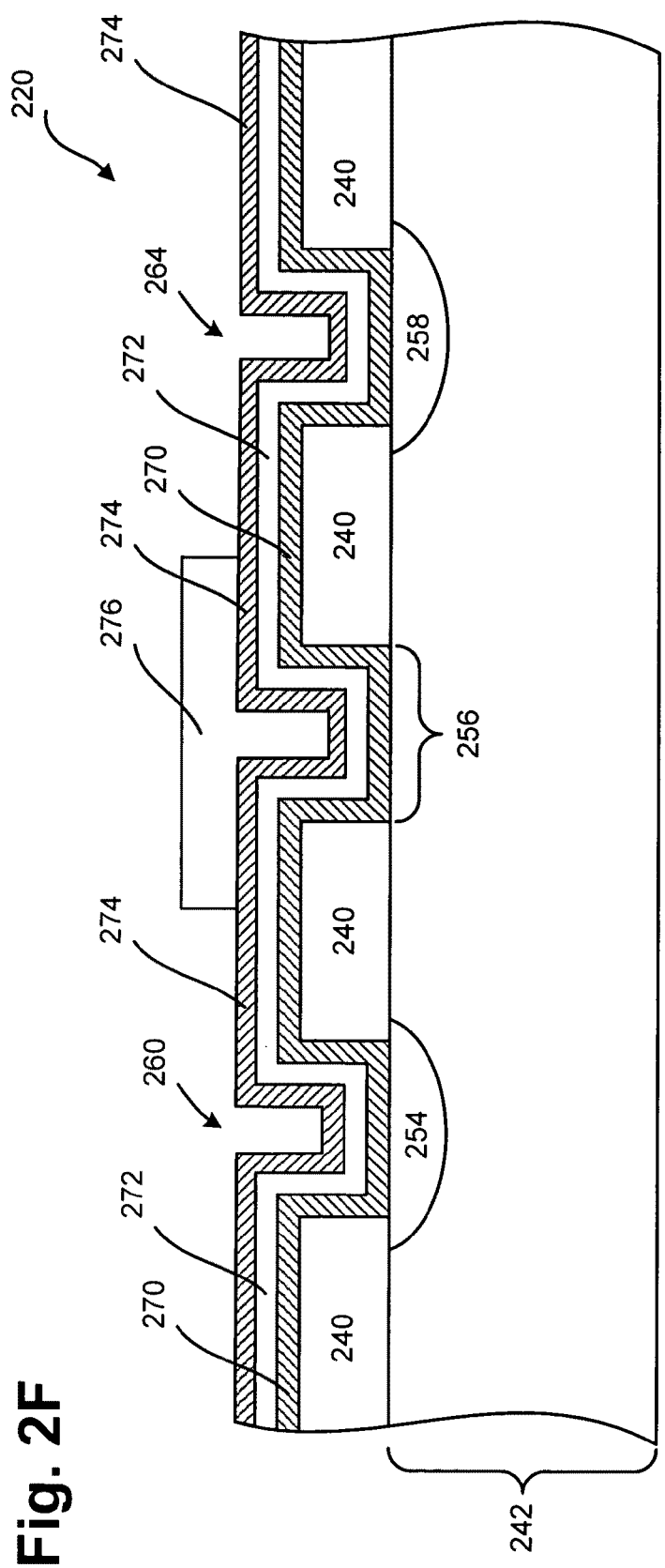
FIG. 2F shows an exemplary structure resulting from performing an intermediate step according to the flowchart in FIGS. 1A and 1B.

Continuing with step 120 of flowchart 100 and structure 220 in FIG. 2F, step 120 comprises applying photoresist layer 276 only over the gate trench area and the associated portion of the hard mask layer 274.

Figure 2G:
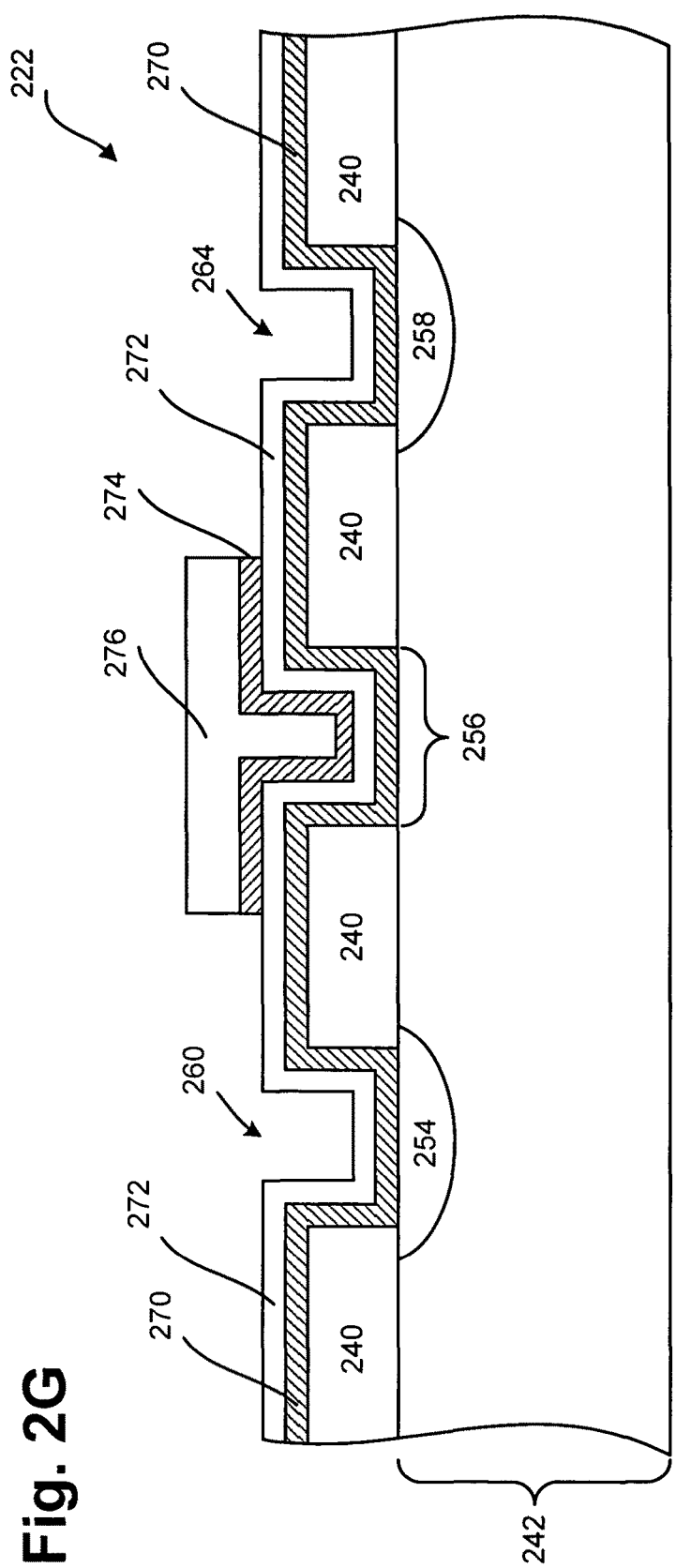
FIG. 2G shows an exemplary structure resulting from performing an intermediate step according to the flowchart in FIGS. 1A and 1B.

Continuing to FIG. 1B for the remaining steps of flowchart 100, as set forth in step 122 of flowchart 100 and as shown as structure 222 of FIG. 2G, step 122 comprises removal of hard mask layer 274 from dielectric trenches 260 and 264 of structure 220 shown in FIG. 2F, i.e. portions of hard mask layer 274 overlying source and drain regions 254 and 258 are removed. Note should be taken that photoresist layer 276 is maintained during this process and that hard mask layer 274 overlying the gate trench area is also maintained despite its removal from the other dielectric trenches 260 and 264. This serves to maintain a covering over diffusion barrier layer 272 which overlies the gate trench area while exposing diffusion barrier layer 272 over dielectric trenches 260 and 264 overlying source and drain regions 254 and 258.

Figure 2H:
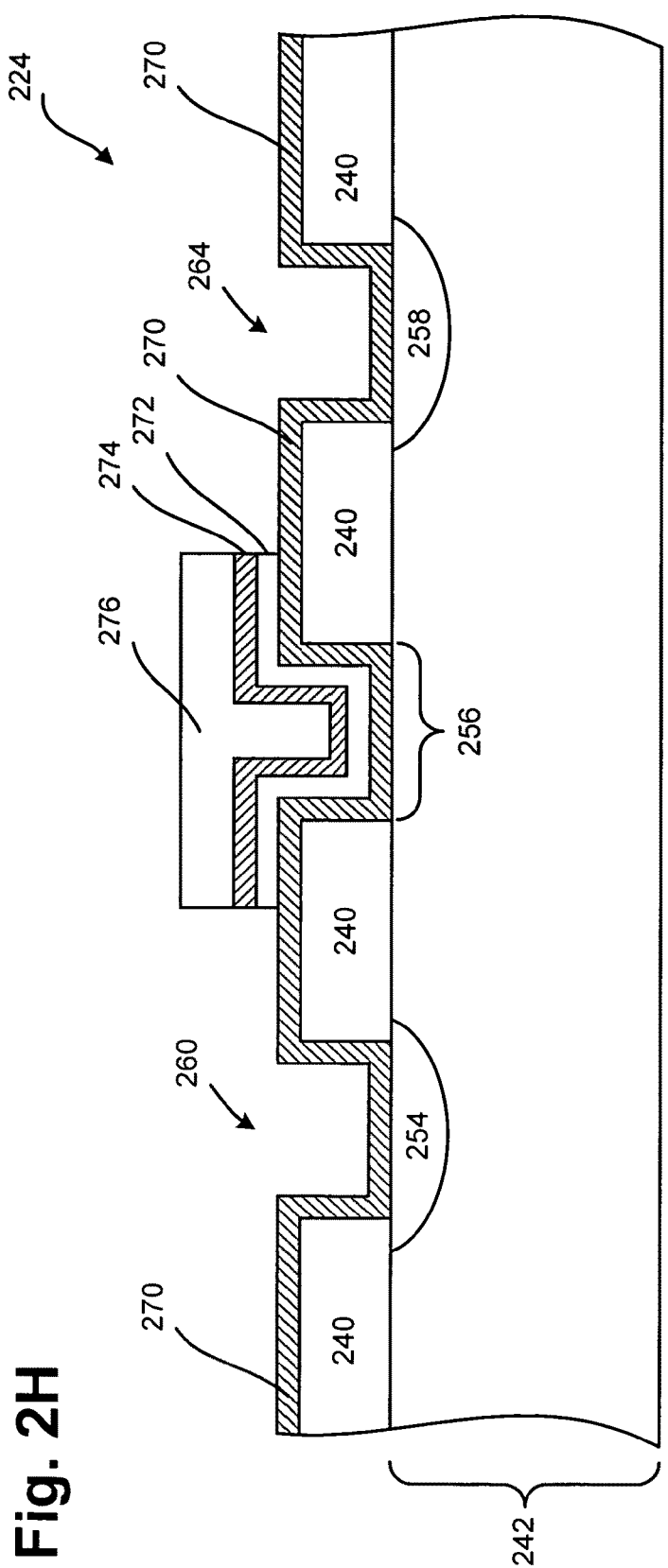
FIG. 2H shows an exemplary structure resulting from performing an intermediate step according to the flowchart in FIGS. 1A and 1B.

As shown in structure 224 of FIG. 2H, step 124 of flowchart 100 comprises removing diffusion barrier layer 272 from dielectric trenches 260 and 264. In one embodiment, a wet etch process is preferred to remove this portion of diffusion barrier 272 from dielectric trenches 260 and 264.

Figure 2I:
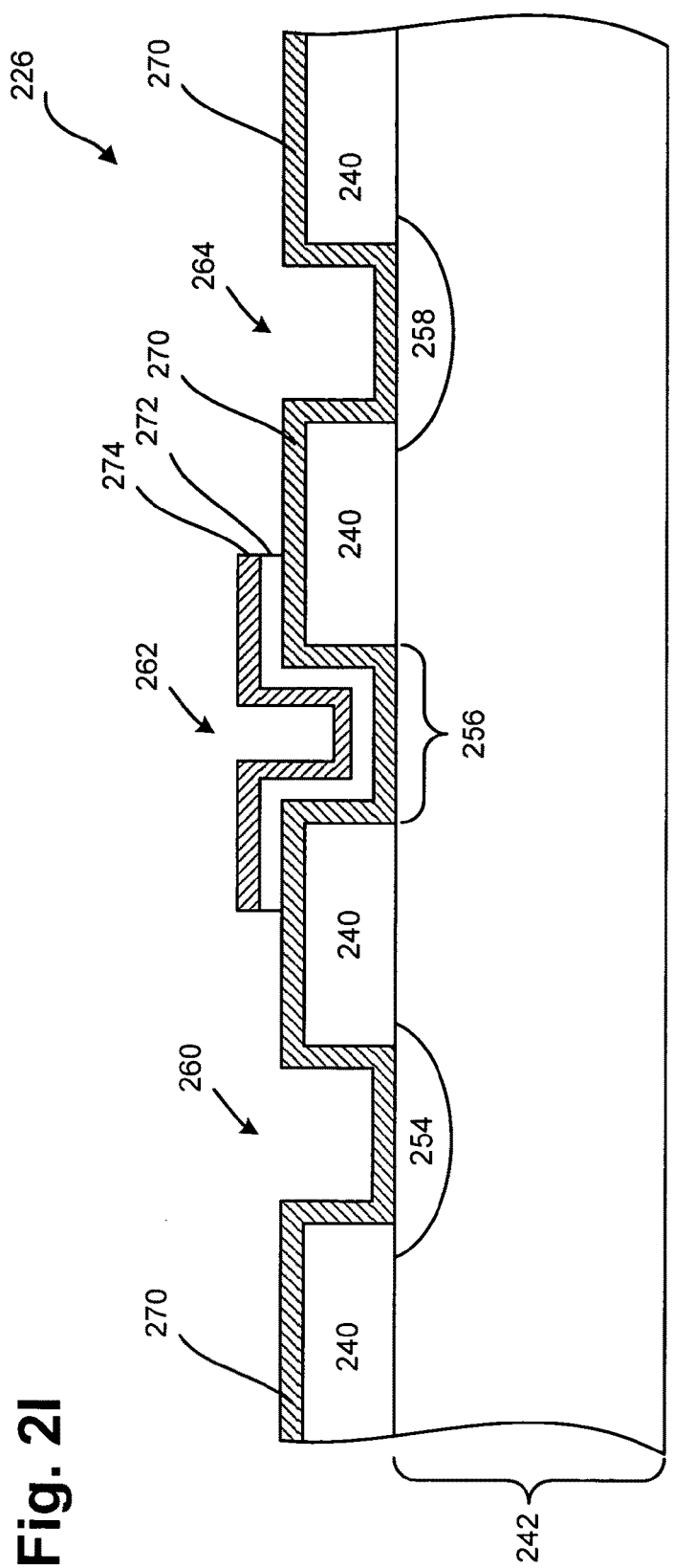
FIG. 2I shows an exemplary structure resulting from performing an intermediate step according to the flowchart in FIGS. 1A and 1B.

As shown by structure 226 of FIG. 2I, step 126 comprises removing photoresist layer 276 overlying dielectric trench 262 to expose hard mask layer 274 over the gate region. As set forth in step 128 of flowchart 100 with corresponding resulting structure 228 shown in FIG. 2J, step 128 comprises removing hard mask layer 274 overlying dielectric trench 262 to expose diffusion barrier layer 272 over the gate region.

This, intermediate structure 228 as shown in FIG. 2J may serve as a starting point to achieve one or more embodiments of the highly conductive source/drain contacts according to the present invention. As such, other processes and/or process steps may be used to obtain the intermediate structure shown in FIG. 2J which may fall within the spirit and scope of the present invention.

Figure 2K:
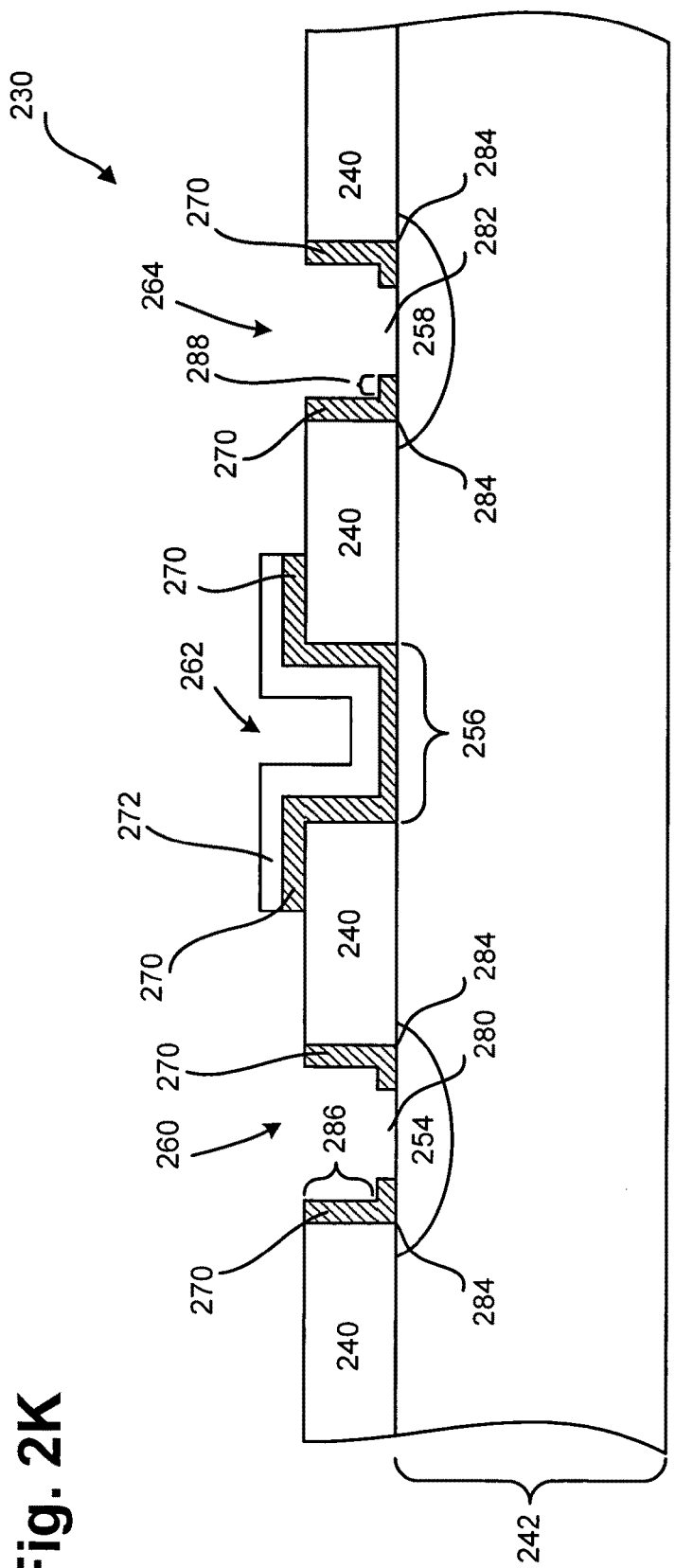
FIG. 2K shows an exemplary structure resulting from performing an intermediate step according to the flowchart in FIGS. 1A and 1B.

Continuing on to step 130 of the flowchart 100 in FIG. 1B and structure 230 in FIG. 2K, exposed gate dielectric 270 in dielectric trench 260 and/or dielectric trench 264 may be etched or otherwise removed in order to provide openings 280 and/or 282 respectively, to expose the underlying semiconductor material present in source and/or drain regions 254 and 258 in III-Nitride semiconductor body 242.

In one embodiment, gate dielectric portions remain after step 130 and include a source/drain trench sidewall gate dielectrics 286 and gate dielectric horizontal protrusions 288. In a preferred embodiment, step 130 includes retaining sidewall gate dielectrics 286 and gate dielectric horizontal protrusions 288 of gate dielectric 270 to cover corners 284 of dielectric trenches 260 and 264. The retained trench sidewall gate dielectrics 286 and gate dielectric horizontal protrusions 288 result in improved or "stuffed-corner" source and drain contacts, which provide protection from subsequent damage to regions defining the source and drain dimensions and result in more predictable source and drain geometries and functions.

Thus, as shown in FIG. 2K and as stated above, in embodiment step 130 also results in formation of gate dielectric horizontal protrusions 288 which project toward the centers of dielectric trenches 260 and 264. Gate dielectric horizontal protrusions 288 and trench sidewall gate dielectrics 286 may have a thickness of approximately 0.1 to 0.2 microns (μm). In the present embodiment shown in FIG. 2K, by preserving the circumscribing trench sidewall gate dielectrics 286 and gate dielectric horizontal protrusions 288, only a center portion of gate dielectric layer 270 is removed from the bottom of dielectric trenches 260 and 264 to provide source opening 280 and drain opening 282.

In an alternative embodiment, step 130 may result in removal of gate dielectric horizontal protrusions 288, or both gate dielectric horizontal protrusions 288 and trench sidewall gate dielectrics 286. These embodiments are not explicitly shown in the drawings.

Figure 2L:
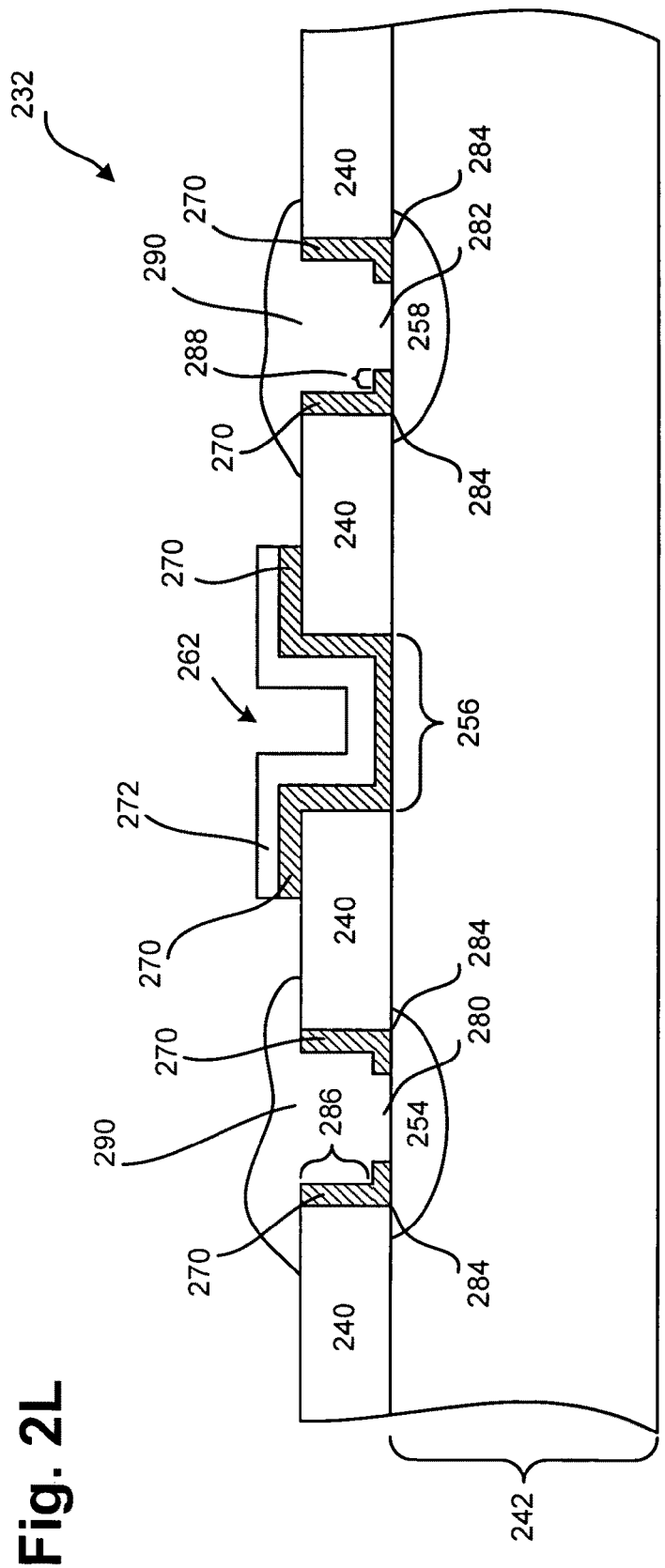
FIG. 2L shows an exemplary structure resulting from performing a final step according to the flowchart in FIGS. 1A and 1B.

Once gate dielectric layer 270 has been removed from the bottoms of dielectric trenches 260 and 264 according to step 130 and structure 230, contact metal 290 may be deposited in dielectric trenches 260 and 264 to form ohmic metal contacts with the top surfaces of source and drain regions 254 and 258 according to step 132 of flowchart 100 in FIG. 1B and as shown in structure 232 of FIG. 2L.

Upon completion of the steps shown in flowchart 100 of FIGS. 1A and 1B, a semiconductor structure is provided which provides highly conductive source/drain contacts, especially for (but not limited to) III-Nitride transistors, such as GaN transistors. According to the present invention, the novel highly conductive source/drain contacts, accompanying structures, and methods for obtaining same as described herein present significant advantages over conventional art, such as the fact that the invention's contacts provide a significantly reduced resistance, for example, resistance that is reduced by a factor of two or more (such as from 0.7 Ω-mm to 0.3 Ω-mm). The significantly reduced source/drain contact resistance in turn results in higher speeds and greater current carrying capability which are particularly important and desirable in power transistors, such as in III-Nitride HEMTs and FETs.

From the above description of the invention, it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

The invention claimed is:

1. A III-Nitride transistor fabricated on a III-Nitride semiconductor body, said III-Nitride transistor comprising:
a gate region, a source region, and a drain region formed over said III-Nitride semiconductor body;
a field dielectric situated over said III-Nitride semiconductor body;
a gate dielectric situated over said gate region, said gate dielectric overlapping said field dielectric adjacent said gate region;
gate dielectric horizontal protrusions situated in at least one of a plurality of dielectric trenches and in contact with said source or drain region;
a diffusion barrier formed over said gate dielectric and not over said source and drain regions, so as to substantially expose said source and drain regions to form ohmic contacts with contact metal deposited in said source and drain regions;
wherein said contact metal deposited in at least one of said source and drain regions extends above and overlies said gate dielectric horizontal protrusions within said at least one of said plurality of dielectric trenches.

2. The III-Nitride transistor of claim 1, wherein trench sidewall gate dielectrics are situated in said plurality of dielectric trenches overlying said source and drain regions.

3. The III-Nitride transistor of claim 1, wherein at least another one of said plurality of dielectric trenches is formed in said field dielectric over said gate region.

4. The III-Nitride transistor of claim 1, wherein said field dielectric comprises silicon nitride.

5. The III-Nitride transistor of claim 1, wherein said gate dielectric comprises silicon nitride.

6. The III-Nitride transistor of claim 1, wherein said diffusion barrier comprises titanium nitride.

7. The III-Nitride transistor of claim 1, wherein said III-Nitride semiconductor body comprises layers of GaN and AlGaN.

* * * * *